United States Patent
Takemura

(10) Patent No.: US 9,543,268 B2
(45) Date of Patent: Jan. 10, 2017

(54) ELECTRONIC COMPONENT, METHOD OF MANUFACTURING SAME, COMPOSITE MODULE INCLUDING ELECTRONIC COMPONENT, AND METHOD OF MANUFACTURING SAME

(71) Applicant: Murata Manufacturing Co., Ltd., Nagaokakyo-shi, Kyoto-fu (JP)

(72) Inventor: Tadaji Takemura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 2 days.

(21) Appl. No.: 14/157,782

(22) Filed: Jan. 17, 2014

(65) Prior Publication Data
US 2014/0131853 A1    May 15, 2014

Related U.S. Application Data

(63) Continuation of application No. PCT/JP2012/004402, filed on Jul. 6, 2012.

(30) Foreign Application Priority Data

Jul. 25, 2011 (JP) .................................. 2011-162477
Jul. 26, 2011 (JP) .................................. 2011-162784

(51) Int. Cl.
*H01L 23/00* (2006.01)
*H01L 23/31* (2006.01)
(Continued)

(52) U.S. Cl.
CPC .............. *H01L 24/81* (2013.01); *H01L 21/78* (2013.01); *H01L 27/04* (2013.01); *H01L 29/41* (2013.01);
(Continued)

(58) Field of Classification Search
CPC .......... H01L 24/81; H01L 21/78; H01L 27/04; H01L 29/41; H01L 24/04; H01L 23/315
(Continued)

(56) References Cited

U.S. PATENT DOCUMENTS 6,078,123 A    6/2000  Tanaka et al.
6,078,229 A *  6/2000  Funada ................. H03H 9/059
                                                     29/25.35
(Continued)

FOREIGN PATENT DOCUMENTS

JP     11-067830 A      3/1999
JP     2000-124767 A    4/2000
(Continued)

OTHER PUBLICATIONS

Ying Hung So et al, Benzocyclobutene based polymers for microelectronics, Chemical innovation, Dec. 2001, vol. 31, No. 12 pp. 40-47.*
(Continued)

*Primary Examiner* — Christine Enad
(74) *Attorney, Agent, or Firm* — Keating & Bennett, LLP

(57) ABSTRACT

A method of manufacturing a composite module prevents a connection electrode electrically coupled to a functional element from separating from a first principal surface of an element substrate. A transmission filter element, a reception filter element, connection electrodes electrically coupled to the transmission filter element and the reception filter element, and an insulating layer surrounding the transmission filter element, the reception filter element, and the connection electrodes are disposed on a first principal surface of an element substrate. The insulating layer covers at least a portion of the surface of each of the connection electrodes. Because the portion of the surface of each of the connection electrodes in an exposed state is covered with the insulating (Continued)

layer, the connection electrodes electrically coupled to the transmission filter element and the reception filter element are prevented from separating from the first principal surface of the element substrate.

12 Claims, 8 Drawing Sheets

(51) Int. Cl.
*H03H 9/05* (2006.01)
*H03H 9/10* (2006.01)
*H01L 21/78* (2006.01)
*H01L 27/04* (2006.01)
*H01L 29/41* (2006.01)

(52) U.S. Cl.
CPC .......... *H03H 9/059* (2013.01); *H03H 9/0542* (2013.01); *H03H 9/1085* (2013.01); *H01L 2924/12042* (2013.01); *H01L 2924/1461* (2013.01); *H01L 2924/15788* (2013.01); *H01L 2924/181* (2013.01)

(58) Field of Classification Search
USPC ........................................... 257/734; 438/113
See application file for complete search history.

(56) References Cited

U.S. PATENT DOCUMENTS

| | | |
|---|---|---|
| 2001/0011857 A1 | 8/2001 | Morishima |
| 2006/0006760 A1* | 1/2006 | Namba et al. ............ 310/313 R |
| 2007/0040281 A1* | 2/2007 | Nakayama et al. .......... 257/778 |
| 2007/0229189 A1* | 10/2007 | Iwata ............................ 333/133 |
| 2011/0095423 A1* | 4/2011 | Ohashi ................. H01L 21/563 257/737 |
| 2011/0133297 A1* | 6/2011 | Franosch et al. ............. 257/416 |

FOREIGN PATENT DOCUMENTS

| | | |
|---|---|---|
| JP | 2002-261582 A | 9/2002 |
| JP | 2003-037471 A | 2/2003 |
| JP | 2003-158436 A | 5/2003 |
| JP | 2008-072748 A | 3/2008 |
| JP | 2009-083008 A | 4/2009 |

OTHER PUBLICATIONS

Dow chemical company, Cyclotene Advance Electronics Resin, Feb. 2005.*

Official Communication issued in International Patent Application No. PCT/JP2012/004402, mailed on Aug. 21, 2012.

* cited by examiner

ELECTRONIC COMPONENT, METHOD OF MANUFACTURING SAME, COMPOSITE MODULE INCLUDING ELECTRONIC COMPONENT, AND METHOD OF MANUFACTURING SAME

BACKGROUND OF THE INVENTION

1. Field of the Invention

The present invention relates to an electronic component in which a functional element, such as a SAW filter element, BAW filter element, MEMS element, or switch IC, is disposed on a first principal surface of an element substrate, a method of manufacturing the same, a composite module including an electronic component, and a method of manufacturing the same.

2. Description of the Related Art

Electronic components in which functional elements, such as surface acoustic wave (SAW) filter elements, bulk acoustic wave (BAW) filter elements, micro-electro-mechanical systems (MEMS) elements, and switch ICs, are disposed on first principal surfaces of element substrates have become popular in recent years. In one such electronic component, each functional element is confined in a predetermined hermetically sealed space to enable a SAW filter element using a surface acoustic wave of an element substrate made of a piezoelectric material or a BAW filter element using a bulk acoustic wave, which is resonance vibration of a piezoelectric film itself, to be properly excited and to enable an MEMS element or switch IC having a mechanical operating portion to normally operate. Confining each functional element in the predetermined hermetically sealed space can prevent degradation in the characteristics of each functional element.

For example, in an electronic component 500 illustrated in FIG. 10 as one known example, a comb-shaped electrode 502 is formed on a first principal surface of an element substrate 501 made of a piezoelectric material, and thus a functional element made of a SAW filter element is disposed. The element substrate 501 is arranged such that the SAW filter element on the first principal surface faces a base substrate 506 (see, for example, Japanese Unexamined Patent Application Publication No. 2003-158436). Connection electrodes including terminal electrodes 503 electrically coupled to the comb-shaped electrode 502 and metal bumps 504 and an insulating layer 505 surrounding the SAW filter element and the connection electrodes are disposed on the first principal surface of the element substrate 501.

Connection terminals 507 are disposed on a mounting surface of the base substrate 506, and mounting electrodes 508 for use in external connection are disposed on its opposite surface. The connection terminals 507 and the mounting electrodes 508 are electrically coupled to each other with via conductors 509. The metal bumps 504 on the element substrate 501 are connected to the connection terminals 507 on the base substrate 506, the element substrate 501 is mounted on the base substrate 506, and thus a hermetically sealed space surrounded by the insulating layer 505 is formed between the element substrate 501 and the base substrate 506. The SAW filter element is confined in that hermetically sealed space.

The mounting surface of the base substrate 506 is filled with molding resin, and the element substrate 501 is molded and protected by a molding layer 510. Because the above-described configuration enables the comb-shaped electrode 502 (piezoelectric material) arranged in the hermetically sealed space to be properly excited, a surface acoustic wave produced by an input of a signal can normally travel along the surface of the element substrate 501, and degradation in the comb-shaped electrode 502 arranged in the hermetically sealed space can be avoided.

Miniaturization in mobile communication terminals has rapidly advanced in recent years, and there has been a need for further reducing the height and size of composite modules incorporated in the mobile communication terminals. Accordingly, with the aim of reducing the height and size of the above-described electronic component incorporated in each of the composite modules, the electronic component having a bare chip mounting structure is provided. In the electronic component having the bare chip mounting structure, an insulating layer that surrounds a predetermined area in a first principal surface of an element substrate on which a functional element is disposed is laminated with a cover layer. The functional element is confined in a space that is surrounded by the insulating layer and that is formed between the element substrate and the cover layer.

An electronic component having a wafer level-chip size package (WL-CSP) structure can have a configuration in which a cover layer is removed to further reduce its height and size. In that case, however, because a connection electrode disposed on a first principal surface of an element substrate included in the electronic component and electrically coupled to a functional element is in an exposed state, after the electronic component is manufactured, the connection electrode may separate, for example, in the course of moving the electronic component.

SUMMARY OF THE INVENTION

In view of the above, a preferred embodiment of the present invention provides a technique capable of preventing a connection electrode electrically coupled to a functional element in an electronic component from separating from a first principal surface of an element substrate.

Another preferred embodiment of the present invention provides a technique capable of joining an insulating layer on the element substrate and a mounting surface of a module substrate in a state where both are in close contact with each other with no gap therebetween and reliably electrically coupling the functional element on the element substrate and the module substrate.

An electronic component according to a preferred embodiment of the present invention includes an element substrate, a functional element disposed on a first principal surface of the element substrate, a connection electrode disposed on the first principal surface and electrically coupled to the functional element, and an insulating layer surrounding the functional element and the connection electrode and disposed on the first principal surface, and the insulating layer is disposed on the first principal surface so as to cover at least a portion of a surface of the connection electrode.

The height of the insulating layer measured from the first principal surface may preferably be greater than the height of the connection electrode measured from the first principal surface. According to such a configuration, the height of the insulating layer measured from the first principal surface of the element substrate is equal to or greater than that of the connection electrode. Thus, for example, at the time of mounting the electronic component on a module substrate of a composite module, the insulating layer always reaches a mounting surface of the module substrate ahead of the connection electrode, even if there are curves or undulations in the module substrate or element substrate. As a result, the insulating layer and the mounting surface of the module substrate are reliably connected to each other.

The connection electrode may be made of solder, and the insulating layer may be made of resin that softens at a temperature lower than a melting temperature of the solder and that cures at the melting temperature of the solder. According to such a configuration, the connection electrode is made of the solder, and the insulating layer is made of the resin softening at the temperature lower than the melting temperature of the solder and curing at the melting temperature of the solder. Accordingly, for example, at the time of mounting the electronic component on the module substrate in the composite module, heating at a temperature lower than the melting temperature of the solder enables the insulating layer to soften without melting the solder and enables the insulating layer and the mounting surface of the module substrate to come into close contact with each other with no gap and be joined together. Heating at a temperature at which the solder melts after the insulating layer and the mounting surface of the module substrate come into close contact with each other and are joined together enables the solder to melt and enables the connection electrode and the mounting electrode to be joined together. At this time, because the insulating layer cures at the melting temperature of the solder, the cured insulating layer prevents the melted solder from spreading out.

The insulating layer may be disposed on the first principal surface so as to cover the entire surface of the connection electrode. According to such a configuration, because the insulating layer is disposed on the first principal surface of the element substrate so as to cover the entire surface of the connection electrode, foreign matter is prevented from adhering to the connection electrode on the first principal surface of the element substrate before the electronic component is mounted on the module substrate in the composite module, for example, in the course of moving the electronic component.

The element substrate may preferably be made of a piezoelectric material, and the functional element may preferably be a SAW filter element including a comb-shaped electrode on the first principal surface thereof. According to such a configuration, the element substrate is made of the piezoelectric material, the functional element is the SAW filter element including the comb-shaped electrode on the first principal surface of the element substrate, and thus the electronic component having a practical configuration is provided.

A composite module according to a preferred embodiment of the present invention includes a module substrate on which the electronic component according to any of the above-described preferred embodiments of the present invention is mounted. The electronic component is mounted on a mounting surface of the module substrate from the first principal surface side, and a space surrounded by the insulating layer is defined between the element substrate and the module substrate. According to such a configuration, the electronic component is mounted on the mounting surface of the module substrate from the side adjacent to the first principal surface of the element substrate, the space surrounded by the insulating layer is defined between the element substrate and the module substrate, and the functional element is confined in that space. Unlike known examples, the insulating layer on the element substrate is not laminated with a cover layer, and the height and size of the composite module including the electronic component is further reduced correspondingly.

A method of manufacturing an electronic component according to a preferred embodiment of the present invention includes the steps of forming a plurality of functional elements on a first principal surface of a wafer, forming a plurality of connection electrodes on the first principal surface of the wafer, the plurality of connection electrodes disposed for the respective functional elements and individually electrically coupled to the functional elements, forming a resin layer made of photosensitive resin on the first principal surface of the wafer, forming an insulating layer by processing the resin layer by photolithography, the insulating layer surrounding the functional elements and the connection electrodes electrically coupled to the functional elements for each combination of one or more of the functional elements and one or more of the connection electrodes and covering at least a portion of a surface of each of the connection electrodes, and singulating the wafer by dicing into element substrates each provided with the combination of one or more of the functional elements and one or more of the connection electrodes and the insulating layer surrounding the combination on the first principal surface of the wafer.

According to such a configuration, the plurality of functional elements are formed on the first principal surface of the wafer, and the plurality of connection electrodes disposed for the respective functional elements and individually electrically coupled to the functional elements are formed. The resin layer made of the photosensitive resin is formed on the first principal surface of the wafer. The formed resin layer is processed by photolithography, thus forming the insulating layer surrounding the functional elements and the connection electrodes electrically coupled to the functional elements for each combination of the functional element and the connection electrode and covering at least a portion of a surface of each of the connection electrodes. Subsequently, the wafer is singulated by dicing into element substrates each provided with the combination of the functional element and the connection electrode and the insulating layer surrounding the combination on the first principal surface of the wafer. In this way, the electronic component is manufactured. Accordingly, unlike known examples, the insulating layer is not laminated with a cover layer, and the electronic component having a correspondingly reduced height and size is provided. Because the insulating layer covers the portion of the surface of the connection electrode in the exposed state, the electronic component is provided in which the connection electrode electrically coupled to the functional element is prevented from separating from the first principal surface of the element substrate.

A method of manufacturing a composite module according to a preferred embodiment of the present invention includes a step of preparing an element substrate with a first principal surface on which a functional element and a plurality of connection electrodes electrically coupled to the functional element are disposed, a step of forming an insulating layer made of resin on the first principal surface of the element substrate, the insulating layer surrounding the functional element and the connection electrodes, a step of mounting the element substrate on a mounting surface of a module substrate from the first principal surface side, a pressure bonding step of heating the element substrate while pressing the element substrate against the module substrate, softening the insulating layer, attaching the insulating layer to the mounting surface by pressure bonding, and attaching the connection electrodes to mounting electrodes on the mounting surface by pressure bonding, and a curing step of curing the insulating layer at a temperature higher than a temperature in the pressure bonding step.

According to such a configuration, the element substrate with the first principal surface on which the functional element and the plurality of connection electrodes electrically coupled to the functional element are disposed is prepared, and the insulating layer made of resin surrounding the functional element and the connection electrodes is formed on the first principal surface of the element substrate. After the element substrate is mounted on the mounting surface of the module substrate from the side adjacent to the first principal surface, the element substrate is heated while being pressed against the module substrate in the pressure bonding step, and thus the insulating layer is softened and pressed and forced over the surface. As a result, the softened insulating layer is in close contact with the mounting surface with no gap and is attached thereto by pressure bonding, and the connection electrode is reliably attached to the mounting electrode on the mounting surface by pressure bonding. Accordingly, heating at a temperature higher than that in the pressure bonding step and thus curing the insulating layer in the curing step in a state where the insulating layer on the element substrate is in close contact with the mounting surface of the module substrate with no gap and the connection electrode on the element substrate is reliably attached to the mounting electrode on the mounting surface of the module substrate by pressure bonding enables the insulating layer on the element substrate and the mounting surface of the module substrate to be joined together in the state where they are in close contact with each other with no gap and enables the functional element on the element substrate and the module substrate to be electrically coupled to each other reliably.

The pressure bonding step of softening the insulating layer and the curing step of curing the insulating layer can be sequentially performed in single heating processing with only different temperature conditions. As a result, the heating time is shortened, which prevents heating from causing damage to the insulating layer, degrading the strength of joining the insulating layer and the mounting surface of the module substrate, and degrading the functional element. In addition, the element substrate is mounted on the mounting surface of the module substrate from the side adjacent to the first principal surface, the space surrounded by the insulating layer is defined between the element substrate and the module substrate, and the functional element is confined in that space. Unlike known examples, the insulating layer on the element substrate is not laminated with a cover layer, and the height and size of the composite module is further reduced correspondingly.

The insulating layer may be formed so as to cover the periphery of each of the connection electrodes. According to such a configuration, because the insulating layer is formed so as to cover the periphery of each of the connection electrodes, there are no possibilities that, at the time of joining the connection electrodes and the mounting electrodes using various binders, including solder, a brazing material, metal nanoparticle paste, and a conductive adhesive, a melted binder would spread out and the space surrounded by the insulating layer and formed between the element substrate and the module substrate would be filled with gas or the like produced by heating the binder. This prevents degradation in the characteristics of the functional element arranged in the space surrounded by the insulating layer.

Each of the connection electrodes may be made of solder, and the resin forming the insulating layer may soften at a temperature lower than a melting temperature of the solder and cure at the melting temperature of the solder. The method may further include a melting step of melting each of the connection electrodes by heating the connection electrode at a temperature at which the solder melts that is higher than the temperature in the pressure bonding step. The melting step may be performed subsequently to the pressure bonding step. The heating temperature in the curing step may be lower than the melting temperature of the solder. According to such a configuration, the connection electrode is made of the solder, and the insulating layer is made of the resin softening at the temperature lower than the melting temperature of the solder and curing at the melting temperature of the solder. Accordingly, heating at the temperature lower than the melting temperature of the solder in the pressure bonding step enables the insulating layer to soften without melting the solder and enables the insulating layer and the mounting surface of the module substrate to be in close contact with each other. Performing the melting step of melting the connection electrode by heating it at the temperature at which the solder melts, the temperature being higher than the heating temperature in the pressure bonding step, enables the solder to melt and enables the connection electrode to be connected to the mounting electrode on the mounting surface of the module substrate. At this time, because the insulating layer cures at the melting temperature of the solder, the cured insulating layer prevents the melted solder from spreading out. Setting the heating temperature in the curing step at a temperature lower than the melting temperature of the solder prevents the solder from re-melting during the curing step.

In the pressure bonding step, ultrasonic vibration may preferably be applied to the connection electrodes. According to such a configuration, because the ultrasonic vibration is applied to the connection electrode in the pressure bonding step, the connection electrode and the mounting electrode are more reliably connected to each other.

The element substrate may preferably be made of a piezoelectric material, and the functional element may preferably be a SAW filter element including a comb-shaped electrode located on the first principal surface of the element substrate and may preferably be arranged in a space that is surrounded by the insulating layer and that is defined between the element substrate and the module substrate. According to such a configuration, the element substrate is made of the piezoelectric material and the functional element is the SAW filter element including the comb-shaped electrode on the first principal surface of the element substrate, and thus the composite module having a practical configuration is provided. Arranging the SAW filter element in the space surrounded by the insulating layer and between the element substrate and the module substrate prevents degradation in the SAW filter element.

The height of the insulating layer measured from the first principal surface of the element substrate may preferably be equal to or greater than the height of each of the connection electrodes measured from the first principal surface of the element substrate. According to such a configuration, because the height of the insulating layer measured from the first principal surface of the element substrate is equal to or greater than that of each of the connection electrodes, at the time of mounting the element substrate on the module substrate, the insulating layer always reaches the mounting surface of the module substrate ahead of the connection electrode, even if there are curves or undulations in the module substrate or element substrate. Thus, the insulating layer and the mounting surface of the module substrate are reliably connected to each other.

The insulating layer may preferably be disposed on the first principal surface of the element substrate so as to cover the entire surface of each of the connection electrodes. According to such a configuration, because the insulating layer is disposed on the first principal surface of the element substrate so as to cover the entire surface of each of the connection electrodes, foreign matter is prevented from adhering to the connection electrode on the first principal surface of the element substrate before the element substrate is mounted on the module substrate in a process for manufacturing the composite module.

According to various preferred embodiments of the present invention, unlike known examples, the insulating layer is not laminated with a cover layer, and the height and size of the electronic component are significantly reduced correspondingly. In addition, because the insulating layer covers a portion of the surface of the connection electrode in the exposed state, the connection electrode electrically coupled to the functional element in the electronic component is prevented from separating from the first principal surface of the element substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
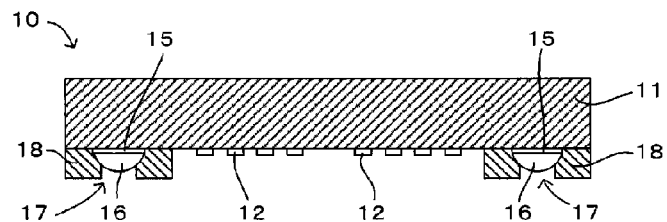
FIGS. 1A-1C include illustrations of a composite module including an electronic component according to a first preferred embodiment of the present invention.
Figure 1B:
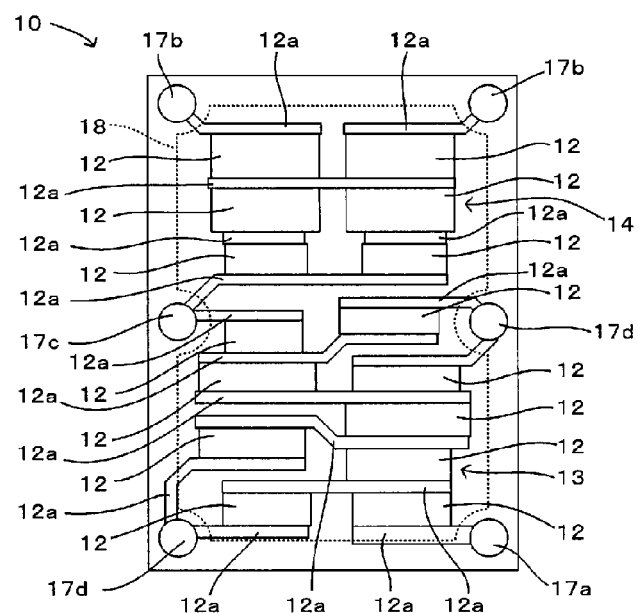
Figure 1C:
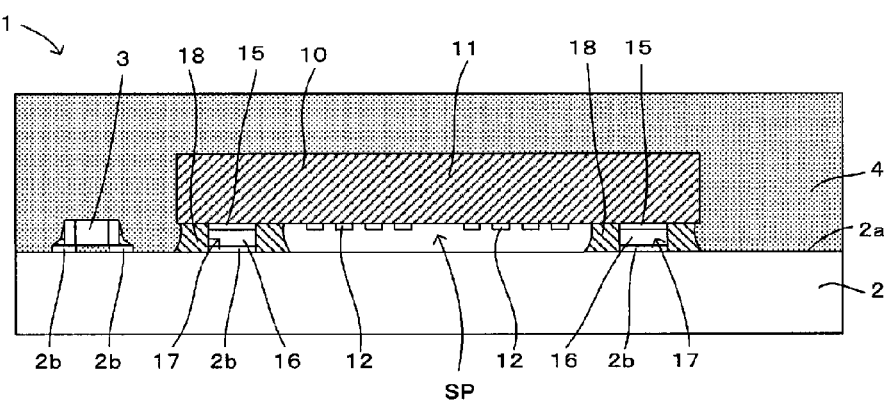

A first preferred embodiment of a composite module including an electronic component (duplexer) according to a preferred embodiment of the present invention is described below with reference to FIGS. 1A to 4C. FIGS. 1A-1C include illustrations of the composite module including the electronic component according to the first preferred embodiment of the present invention, wherein FIG. 1A is a cross-sectional view of the electronic component, FIG. 1B is a bottom view of the electronic component, and FIG. 1C is a cross-sectional view of the composite module. FIGS. 2A-2E include illustrations of one example of a method of manufacturing the electronic component illustrated in FIGS. 1A-1C, wherein FIGS. 2A-2E illustrate different states. FIGS. 3A-3C and 4A-4C illustrate different states of one example of a method of manufacturing the composite module illustrated in FIGS. 1A-1C. FIGS. 4A-4C depict a continuation of the method illustrated in FIGS. 3A-3C. FIGS. 1A to 4C illustrate only a fundamental configuration in the present invention and do not illustrate the other configuration. FIGS. 5A to 8, which illustrate second to fourth preferred embodiments and are described below, are illustrations depicted in substantially the same manner as in FIGS. 1A to 4C, and description thereof is omitted below.

A duplexer 10, which is an example of an electronic component according to a preferred embodiment of the present invention, preferably has a bare chip mounting structure and includes an element substrate 11, a transmission filter element and a reception filter element 14 disposed on a first principal surface of the element substrate 11, connection electrodes 17 including terminal electrodes 15 and metal bumps which are electrically coupled to the transmission filter element 13 and the reception filter element 14, and an insulating layer 18.

The element substrate 11 preferably is made of a piezoelectric material, such as lithium niobate, lithium tantalate, or quartz. As illustrated in FIG. 1B, the transmission filter element 13 and the reception filter element 14, which are examples of functional elements according to a preferred embodiment of the present invention, are provided in predetermined areas of the first principal surface of the element substrate 11. The transmission filter element 13 and the reception filter element 14 have different pass bands for high-frequency signals.

Each of the transmission filter element 13 and the reception filter element 14 includes a surface acoustic wave (SAW) filter element on the first principal surface of the element substrate 11. The SAW filter element includes comb-shaped electrodes 12 (IDT electrodes) and wiring electrodes 12a made of, for example, aluminum, copper, nickel, gold, or platinum, on the first principal surface of the element substrate 11. In the present preferred embodiment, the reception filter element 14 includes a balanced output type reception filter.

The connection electrodes 17 are formed from the transmission filter element 13 and the reception filter element 14, and the terminal electrodes 15 and the metal bumps 16 which are electrically connected to each other through the wiring electrodes 12a. The connection electrodes 17 include a transmission terminal 17a connected to the input side of the transmission filter element 13, reception terminals 17b connected to the output side of the reception filter element 14, a common terminal 17c (antenna terminal) connected to the output side of the transmission filter element 13 and the input side of the reception filter element 14, and ground terminals 17d.

The terminal electrodes 15 are made of, for example, aluminum, copper, nickel, gold, or platinum, and located on the first principal surface of the element substrate 11, as in the comb-shaped electrodes 12. The metal bumps 16 are made of solder having a melting temperature of approximately 220° C. and located on the corresponding terminal electrodes 15. The solder defining the metal bumps 16 is made of Sn—Ag—Cu, for example.

The insulating layer 18 surrounds the comb-shaped electrodes 12 and the connection electrodes 17 and is disposed on the first principal surface of the element substrate 11. As illustrated in FIG. 1A, the insulating layer 18 is arranged so as to cover the entire periphery of the edge portion of each of the connection electrodes 17 and arranged such that its height measured from the first principal surface of the element substrate 11 is greater than the height of the connection electrode 17.

The insulating layer 18 is preferably made of photosensitive epoxy resin or polyimide resin, for example. In the present preferred embodiment, resin having a property that causes the resin to soften at a temperature (approximately 100° C.) lower than the melting temperature (approximately 220° C.) of the solder of the metal bumps 16 and is cured by being continuously heated at a temperature equal to or higher than approximately 180° C. is preferably used as the resin forming the insulating layer 18.

In FIG. 1B, only the position where the insulating layer 18 is located on the first principal surface of the element substrate 11 is indicated by the dotted lines, and the insulating layer 18 is not illustrated.

A composite module 1 is mounted on a mother board included in a mobile communication terminal, such as a cellular phone or a mobile information terminal, and includes the duplexer 10, which includes the transmission filter element 13 and the reception filter element 14, a module substrate 2, various components 3, such as a switch IC, a filter, a chip resistor, a chip capacitor, and a chip coil, and a molding layer 4. The composite module 1 preferably is a high-frequency antenna switch module, for example.

The duplexer 10 and the various components 3 are mounted on mounting electrodes 2b disposed on a mounting surface 2a of the module substrate 2 and electrically coupled to a plurality of external connection electrodes (not illustrated) on the back side of the module substrate 2 through internal wiring patterns (not illustrated) in the module substrate 2. The composite module 1 is mounted on the mother board, and thus various signal lines, including an antenna line ANT, a ground line GND, a transmission signal line Tx, and a reception signal line Rx, and a power source line, which are included in the mother board, are connected to the composite module 1. This allows transmission and reception signals to be exchanged between the mother board and the composite module 1.

The module substrate 2 in the present preferred embodiment is preferably an integral ceramic lamination including a plurality of stacked and fired dielectric layers made of ceramic green sheets. That is, the ceramic green sheet defining each of the dielectric layers is formed as a sheet by a film forming device from slurry in which mixture powder, such as alumina and glass, is mixed with an organic binder, a solvent, and the like. The ceramic green sheet can be fired at a low temperature around approximately 1000° C., so-called, low-temperature fired. The ceramic green sheet cut into a predetermined shape, and a via hole is formed in the ceramic green sheet by laser processing and so on. A via conductor for use in interlayer connection is formed by filling the formed via hole with conductive paste containing silver or copper or providing via-filling plating on the formed via hole. Various electrode patterns are formed by printing using the conductive paste, and thus the dielectric layers are formed.

The via conductors and electrode patterns are properly formed on the dielectric layers, and the internal wiring patterns electrically coupling the duplexer 10 and the various components 3 mounted on the module substrate 2, the mounting electrodes 2b and so on, and the external connection electrodes are formed on the module substrate 2. That is, the electrode patterns and the via conductors are properly disposed on the dielectric layers, and the internal wiring patterns and the mounting electrodes 2b are formed, thus electrically coupling the duplexer 10 and the various components 3 mounted on the module substrate 2 to the external connection electrodes. At this time, a circuit element, such as a capacitor or a coil, may be formed from an electrode pattern and a via conductor on each of the dielectric layers. The formed circuit element, such as a capacitor or a coil, and the various components 3 may be combined to define a filter circuit or a matching circuit connected to the duplexer 10.

The duplexer 10 is mounted on the mounting surface 2a of the module substrate 2 from the side adjacent to the first principal surface of the element substrate 11, and thus a space SP surrounded by the insulating layer 18 is formed between the element substrate 11 and the module substrate 2. The transmission filter element 13 and the reception filter element 14 are arranged in the formed space SP.

The molding layer 4 is preferably made of general molding resin, such as epoxy resin. The molding layer 4 protects the duplexer 10 and the various components 3 mounted on the mounting surface 2a of the module substrate 2 from the external environment.

Next, an outline of one example method of manufacturing the duplexer 10 is described.

Figure 2A:
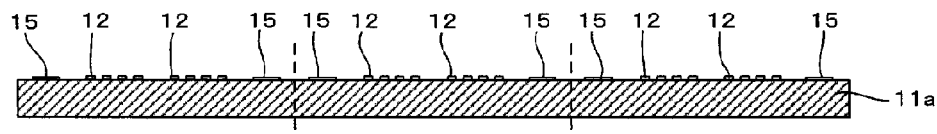
FIG. 2A-2E include illustrations of one example of a method of manufacturing the electronic component illustrated in FIGS. 1A-1C.

First, as illustrated in FIG. 2A, the comb-shaped electrodes 12 and the wiring electrodes 12a (not shown) are formed on the first principal surface of a wafer 11a made of a piezoelectric material by photolithography, thus forming the plurality of transmission filter elements 13 and reception filter elements 14 and also forming the terminal electrodes 15 individually electrically coupled to the transmission filter elements 13 and reception filter elements 14.

Figure 2B:
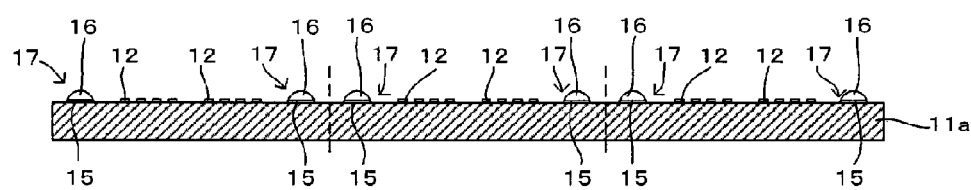
Figure 2C:
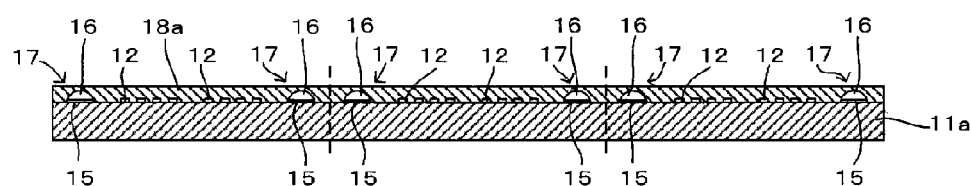

Next, as illustrated in FIG. 2B, the metal bumps 16 made of solder are formed on the respective terminal electrodes 15, and thus the connection electrode 17 is formed for each of the transmission filter elements 13 and the reception filter elements 14. Then, as illustrated in FIG. 2C, a resin layer 18a is formed on the first principal surface of the wafer 11a using, for example, photosensitive polyimide resin.

Figure 2D:
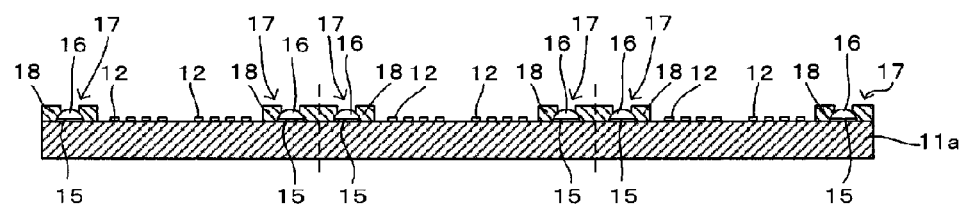

Subsequently, as illustrated in FIG. 2D, the resin layer 18a is processed by photolithography, and a portion that covers the transmission filter elements 13, the reception filter elements 14, and the connection electrodes 17 is removed from the resin layer 18a. Then, the insulating layer 18 is formed so as to surround the transmission filter elements 13, the reception filter elements 14, and the connection electrodes 17 electrically coupled to the transmission filter elements 13 and the reception filter elements 14 for each combination of the transmission filter element 13, the reception filter element 14, and the connection electrodes 17 and so as to cover the entire periphery of the edge portion of each of the connection electrodes 17.

Figure 2E:
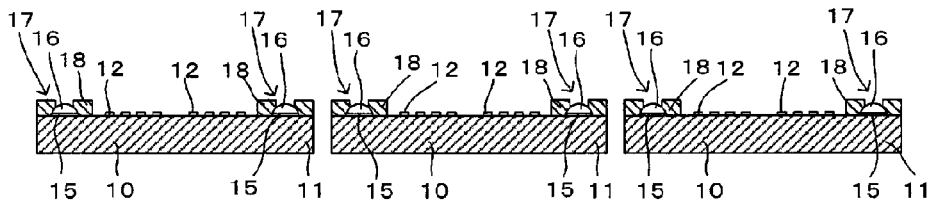

Lastly, as illustrated in FIG. 2E, the wafer 11a is diced and singulated into the element substrates 11 each including the first principal surface on which the combination of the transmission filter element 13, the reception filter element 14, and the connection electrodes 17 and the insulating layer 18 surrounding the combination are disposed. In this way, the duplexers 10 are completed. The broken lines illustrated in FIGS. 2A to 2D indicate positions at which the wafer 11a is to be diced.

Next, an outline of one example method of manufacturing the composite module 1 is described.

Figure 3A:
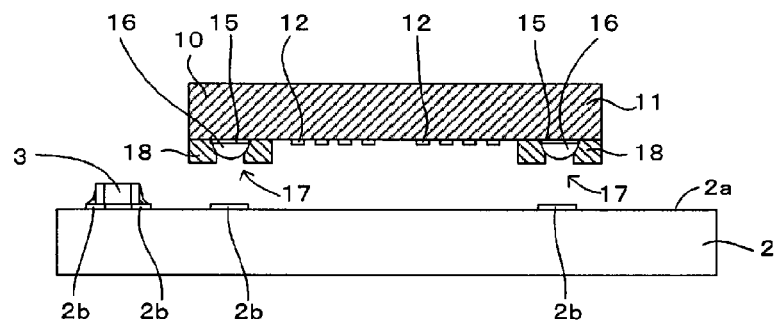
FIGS. 3A-3C include illustrations of one example of a method of manufacturing the composite module illustrated in FIGS. 1A-1C.
Figure 4A:
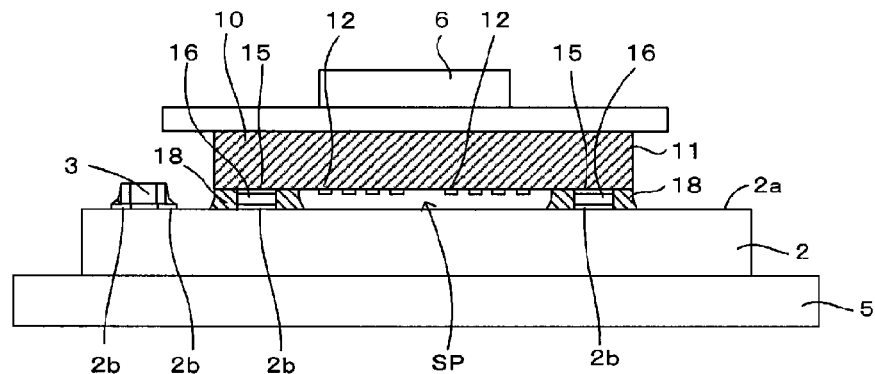
FIGS. 4A-4C include illustrations of one example of the method of manufacturing the composite module illustrated in FIGS. 1A-1C.
Figure 4B:
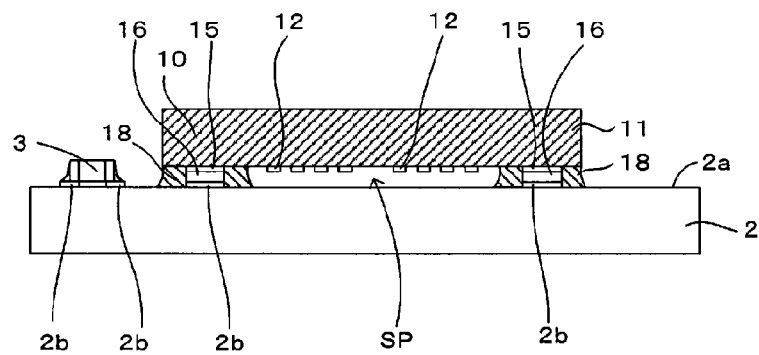
Figure 4C:
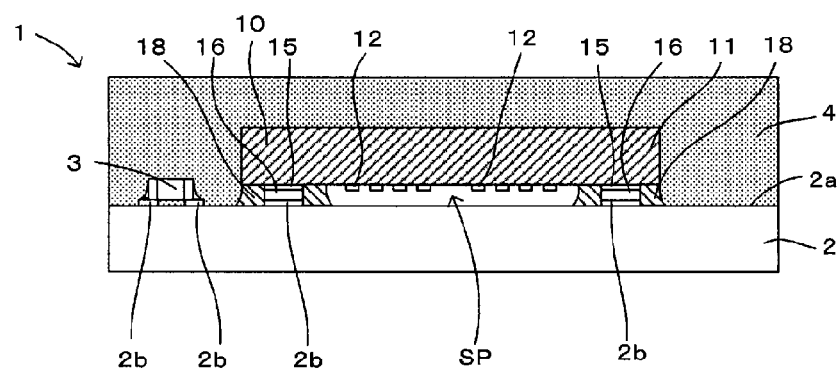

First, as illustrated in FIG. 3A, the duplexer 10 and the module substrate 2 are prepared. The duplexer 10 includes the element substrate 11 with the first principal surface on which the transmission filter element 13, the reception filter element 14, the connection electrodes 17, and the insulating layer 18 surrounding the transmission filter element 13, the reception filter element 14, and the connection electrodes 17 are disposed. The module substrate 2 includes the mounting surface 2a on which the various components 3, which do not include the duplexer 10, are mounted.

Figure 3B:
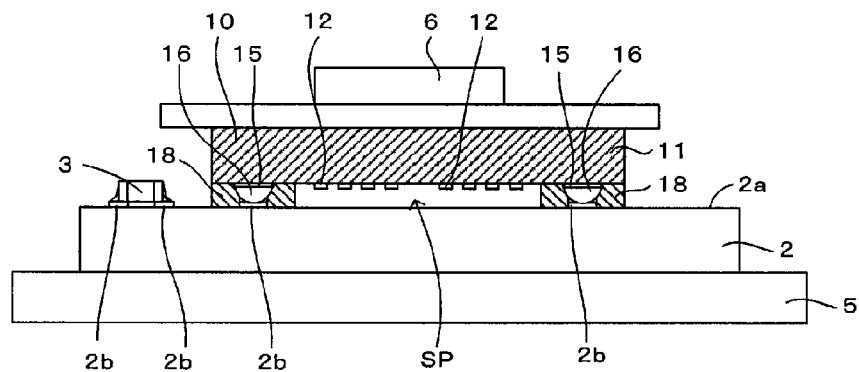

Next, as illustrated in FIG. 3B, the duplexer 10 is mounted on the mounting surface 2a of the module substrate 2 on a stage 5 from the side adjacent to the first principal surface. The duplexer 10 is pressed against the module substrate 2 by a head 6 of a flip chip bonding (FCB) machine including a suction holding mechanism, and a heater (not illustrated) included in at least one of the stage 5 and the head 6 starts heating.

Figure 3C:
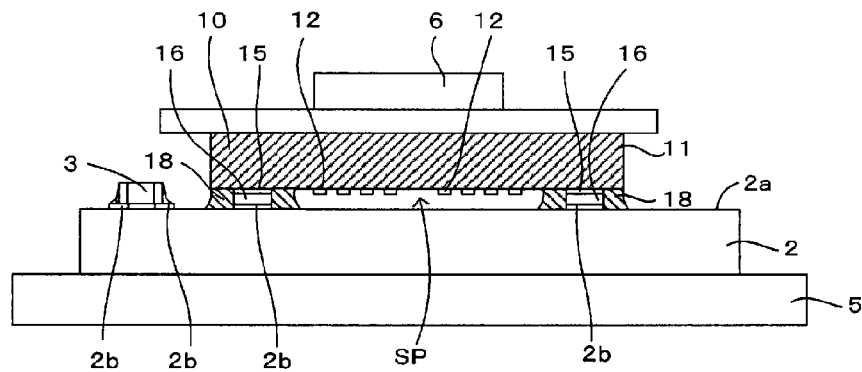

Subsequently, as illustrated in FIG. 3C, the duplexer (element substrate 11) is heated at approximately 100° C. while being pressed against the module substrate 2. As a result, the insulating layer 18 softens and is attached to the mounting surface 2a of the module substrate 2 by pressure bonding, and the connection electrodes 17 (metal bumps 16) are attached to the mounting electrodes 2b on the mounting surface 2a of the module substrate 2 by pressure bonding (pressure bonding step). In the pressure bonding step, ultrasonic vibration may be applied to the connection electrodes 17 by an ultrasonic vibration applying device including, for example, a horn and a vibrator, which are not illustrated.

Next, as illustrated in FIG. 4A, the duplexer 10 is heated at approximately 250° C., which is higher than the heating temperature in the pressure bonding step. As a result, the metal bumps 16 are melted, and the insulating layer 18 starts its curing (melting step). Then, as illustrated in FIG. 4B, the module substrate 2 on which the duplexer 10 is mounted is heated by a heating device, such as an oven, in a heating atmosphere at approximately 180° C., which is lower than the melting temperature of the metal bumps 16 and higher than the curing temperature of the insulating layer 18, for approximately one hour. As a result, curing of the insulating layer 18 is completed.

Lastly, the mounting surface 2a of the module substrate 2 on which the duplexer 10 and the various components are mounted is filled with molding resin, it is heated and cured, and thus the molding layer 4 is formed on the module substrate 2. In this way, the composite module 1 is completed.

In the composite module 1 formed in the above-described way, a transmission signal output from the transmission signal line Tx in the mother board to the transmission terminal 17a in the duplexer 10 through the external connection electrode and internal wiring pattern is input into the transmission filter element 13. The input signal is subjected to a predetermined filter process, the processed signal is output from the common terminal 17c toward the module substrate 2, and the signal is output to the antenna line ANT in the mother board through the internal wiring pattern and external connection electrode. A reception signal input from the antenna line ANT in the mother board to the common terminal 17c in the duplexer 10 through the external connection electrode and internal wiring pattern is input into the reception filter element 14, the input signal is subjected to a predetermined filter process, the processed signal is output from the reception terminal 17b toward the module substrate 2, and the signal is output to the reception signal line Rx in the mother board through the internal wiring pattern and external connection electrode.

The module substrate 2 provided with various electrode patterns, including the internal wiring patterns, the mounting electrodes 2b, and the external connection electrodes and so on can be formed from a printed circuit board, an LTCC, an alumina-based substrate, a glass substrate, a composite material substrate, a single layer substrate, or a multilayer substrate and so on made using resin, ceramic, or a polymer material and so on. The module substrate 2 may be formed from an optimal material selected in accordance with the intended use of the composite module 1.

The composite module 1 may be formed in such a way that first, a set of composite modules 1 is formed, and then, the set of composite modules 1 is divided into individual pieces, as in the case of the above-described method of manufacturing the duplexer 10.

As described above, in the present preferred embodiment, the transmission filter element 13, the reception filter element 14, the connection electrodes 17 electrically coupled to the transmission filter element 13 and the reception filter element 14, and the insulating layer 18 surrounding the transmission filter element 13, the reception filter element 14, and the connection electrodes 17 are disposed on the first principal surface of the element substrate 11, and the insulating layer 18 covers at least a portion of the surface of each of the connection electrodes 17.

Accordingly, unlike known examples, the insulating layer 18 is not laminated with a cover layer, and the height and size of the duplexer 10 is further reduced correspondingly. In addition, because the portion of the surface of each of the connection electrodes 17 in an exposed state is covered with the insulating layer 18, the connection electrodes 17 electrically coupled to the transmission filter element 13 and the reception filter element 14 are prevented from separating from the first principal surface of the element substrate 11.

That is, the plurality of transmission filter elements and reception filter elements 14 are formed on the first principal surface of the wafer 11a, and the plurality of connection electrodes 17 individually electrically coupled to the transmission filter elements 13 and reception filter elements 14 are formed for each of the transmission filter elements 13 and reception filter elements 14. Then, the resin layer 18a made of photosensitive polyimide resin is formed on the first principal surface of the wafer 11a, the formed resin layer 18a is processed by photolithography, and thus the insulating layer 18 is formed so as to surround the transmission filter elements 13, the reception filter elements 14, and the connection electrodes 17 electrically coupled to the transmission filter elements 13 and the reception filter elements 14 for each combination of the transmission filter element 13, the reception filter element 14, and the connection electrodes 17 and so as to cover at least a portion of the surface of each of the connection electrodes 17.

Then, the wafer 11a having the first principal surface on which the insulating layer 18 is formed is diced and singulated into the element substrates 11 each having the first principal surface on which the combination of the transmission filter element 13, the reception filter element 14, and the connection electrodes 17 and the insulating layer 18 surrounding the combination are disposed. In this way, the duplexers 10 are produced. Accordingly, unlike known examples, the insulating layer 18 in the duplexer 10 is not laminated with a cover layer, and the duplexer 10 having a correspondingly reduced height and size is provided. Because the portion of the surface of each of the connection electrodes 17 in an exposed state is covered with the insulating layer 18, the duplexer 10 is provided in which the connection electrodes 17 electrically coupled to the transmission filter element 13 and the reception filter element are prevented from separating from the first principal surface of the element substrate 11.

Because the insulating layer 18 is arranged on the first principal surface of the element substrate 11 so as to cover at least the portion of the surface of each of the connection electrodes 17, the duplexer 10 is more miniaturized than a known configuration in which the insulating layer 18 is spaced away from the connection electrode 17.

The element substrate 11 is preferably made of a piezoelectric material, and the transmission filter element 13 and the reception filter element 14 are SAW filter elements formed by disposing the comb-shaped electrodes 12 on the first principal surface of the element substrate 11. Thus, the composite module 1 having a practical configuration is provided. In addition, the arrangement of the transmission filter element and the reception filter element 14 in the space SP surrounded by the insulating layer 18 and defined between the element substrate 11 and the module substrate 2 prevents degradation in the transmission filter element 13 and the reception filter element 14.

The duplexer 10 is mounted on the mounting surface 2a of the module substrate 2 from the side adjacent to the first principal surface of the element substrate 11, and thus the transmission filter element 13 and the reception filter element are confined in the space SP surrounded by the insulating layer 18 and defined between the element substrate 11 and the module substrate 2. Unlike known examples, the insulating layer on the element substrate 11 in the duplexer 10 is not laminated with a cover layer, and the height and size of the composite module 1 are further reduced correspondingly.

The duplexer 10 including the element substrate 11 having the first principal surface on which the transmission filter element 13, the reception filter element 14, and the plurality of connection electrodes 17 are disposed is prepared. The insulating layer 18 surrounding the transmission filter element 13, the reception filter element 14, and the connection electrodes 17 is disposed on the first principal surface of the element substrate 11. After the duplexer 10 (element substrate 11) is mounted on the mounting surface 2a of the module substrate 2 from the side adjacent to the first principal surface, the element substrate 11 is heated while being pressed against the module substrate 2 in a pressure bonding step, and thus the insulating layer 18 is softened and pressed and forced over the surface. The softened insulating layer 18 is in close contact with the mounting surface 2a with no gap, and the connection electrodes 17 are reliably attached to the mounting electrodes 2b by pressure bonding.

Accordingly, heating at a temperature higher than that in the pressure bonding step and thus curing the insulating layer 18 in the curing step in a state where the insulating layer 18 on the element substrate 11 is in close contact with the mounting surface 2a of the module substrate 2 with no gap and the connection electrode 17 on the element substrate 11 is reliably attached to the mounting electrode 2b on the mounting surface 2a of the module substrate 2 by pressure bonding enables the insulating layer 18 on the element substrate 11 and the mounting surface 2a of the module substrate 2 to be joined together in the state where they are in close contact with each other with no gap. The transmission filter element 13 and the reception filter element 14 on the element substrate 11 in the duplexer 10 are reliably electrically coupled to the module substrate 2.

Because the insulating layer 18 and the mounting surface 2a of the module substrate 2 are in close contact with each other with no gap, there is no possibility that molding resin being provided to the mounting surface 2a would flow into the space SP in which the transmission filter element 13 and the reception filter element 14 are arranged.

Because the height of the insulating layer 18 measured from the first principal surface of the element substrate 11 is greater than that of the connection electrode 17, at the time of mounting the duplexer 10 on the module substrate 2, the insulating layer 18 always reaches the mounting surface 2a of the module substrate 2 ahead of the connection electrodes 17, even if there are curves or undulations in the module substrate 2 or element substrate 11. Thus, the insulating layer 18 and the mounting surface 2a of the module substrate 2 reliably come into close contact with each other.

Because the insulating layer 18 surrounds the periphery of each of the connection electrodes 17, there is no possibility that the melted metal bumps 16 would spread out or the space SP surrounded by the insulating layer 18 and formed between the element substrate 11 and the module substrate 2 would be filled with an evaporating component of flux or the like produced by heating on the metal bumps 16. This prevents degradation in the characteristics of the transmission filter element 13 and the reception filter element 14 arranged in the space SP surrounded by the insulating layer 18.

The metal bump 16 included in each of the connection electrodes 17 is preferably made of solder, and the insulating layer 18 is preferably made of resin that softens at a temperature (approximately 100° C.) lower than the melting temperature (approximately 220° C.) of the solder and that cures at the melting temperature of the solder. Accordingly, heating at a temperature lower than the melting temperature of the solder in a pressure bonding step enables the insulating layer to soften without melting the solder and enables the insulating layer 18 and the mounting surface 2a of the module substrate 2 to come into close contact with each other.

A melting step of heating the connection electrodes 17 (metal bumps 16) at a temperature at which it melts higher than the heating temperature in the pressure bonding step performed subsequently to the pressure bonding step enables the solder to melt and the connection electrode 17 to be reliably connected to the mounting electrode 2b on the mounting surface 2a of the module substrate 2. At this time, because the insulating layer cures at the melting temperature of the solder, the insulating layer 18 starting its curing reliably prevents spread out of the melting solder. Setting the heating temperature in the curing step at a temperature lower than the melting temperature of the solder prevents the solder from re-melting during the curing step.

The pressure bonding step of softening the insulating layer and joining the solder, the melting step of melting the solder, and the curing step of curing the insulating layer can be sequentially performed in single heating processing with only different temperature conditions. As a result, the heating time in the entire process for manufacturing the composite module 1 is significantly reduced, which prevents excessive heating that would cause damage to the insulating layer 18, degradation in the strength of joining the insulating layer 18 and the mounting surface 2a of the module substrate 2, and degradation in the transmission filter element 13 and the reception filter element 14. Because the steps relating to heating in the process for manufacturing the composite module 1 are simplified, the cost of manufacturing the composite module 1 is reduced.

Applying ultrasonic vibration to the connection electrodes 17 in the pressure bonding step enables the connection electrodes 17 and the mounting electrode 2b to be reliably connected to each other.

The melting step of melting the solder is optional. Only the pressure bonding step of attaching the metal bumps 16 and the mounting electrodes 2b by pressure bonding may be performed, for example.

Second Preferred Embodiment

Figure 5A:
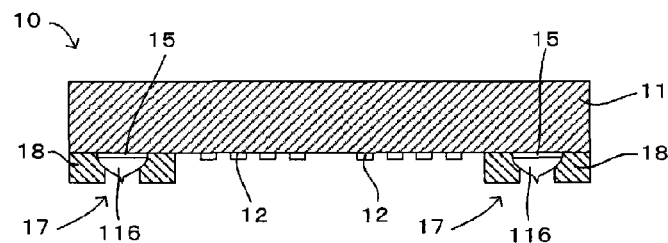
FIGS. 5A-5C include illustrations of a composite module including an electronic component according to a second preferred embodiment of the present invention.
Figure 5B:
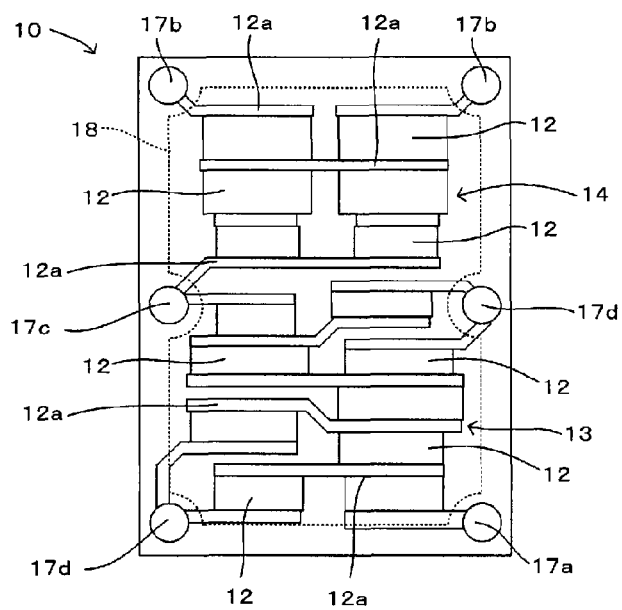
Figure 5C:
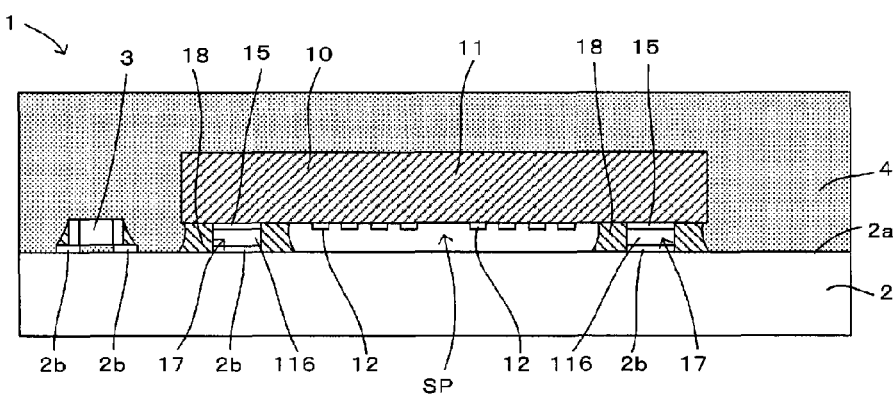

A second preferred embodiment of a composite module including an electronic component (duplexer) according to the present invention is described below with reference to FIGS. 5A to 7B. FIGS. 5A-5C include illustrations of the composite module including the electronic component according to the second preferred embodiment of the present invention, wherein FIG. 5A is a cross-sectional view of the electronic component, FIG. 5B is a bottom view of the electronic component, and FIG. 5C is a cross-sectional view of the composite module. FIGS. 6A-6C and 7A and 7B are illustrations of one example of a method of manufacturing the composite module illustrated in FIGS. 5A-5C. FIGS. 6 to 6C and FIGS. 7A and 7B illustrate different states. FIGS. 7A and 7B depict a continuation of the method shown in FIGS. 6A-6C.

The second preferred embodiment differs from the above-described first preferred embodiment in that a metal bump 116 included in the connection electrode 17 is preferably made of gold, as illustrated in FIG. 5A. The other configuration is preferably the same or substantially the same as that in the above-described first preferred embodiment. The same reference numerals are used to indicate the same or similar elements, and thus the description thereof is omitted.

An outline of another example of a method of manufacturing the composite module 1 in which the duplexer 10 including the metal bumps 116 is mounted on the module substrate 2 is described below.

Figure 6A:
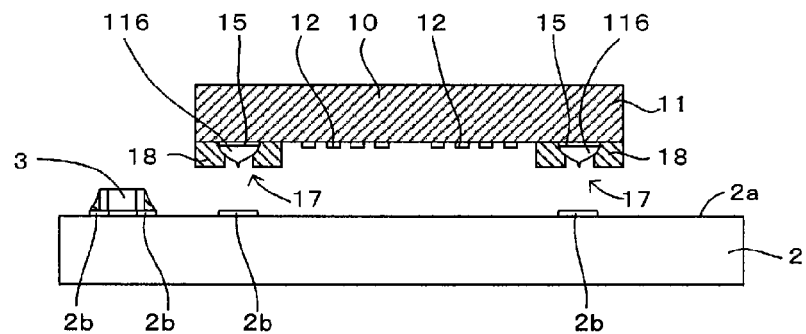
FIGS. 6A-6C include illustrations of one example of a method of manufacturing the composite module illustrated in FIGS. 5A-5C.
Figure 7A:
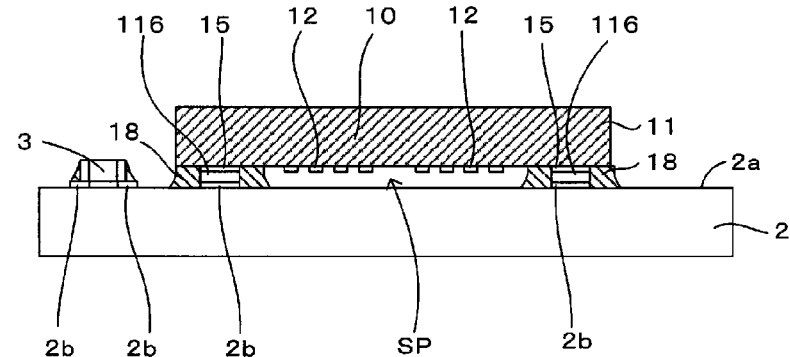
FIGS. 7A and 7B include illustrations of one example of a method of manufacturing the composite module illustrated in FIGS. 5A-5C.
Figure 7B:
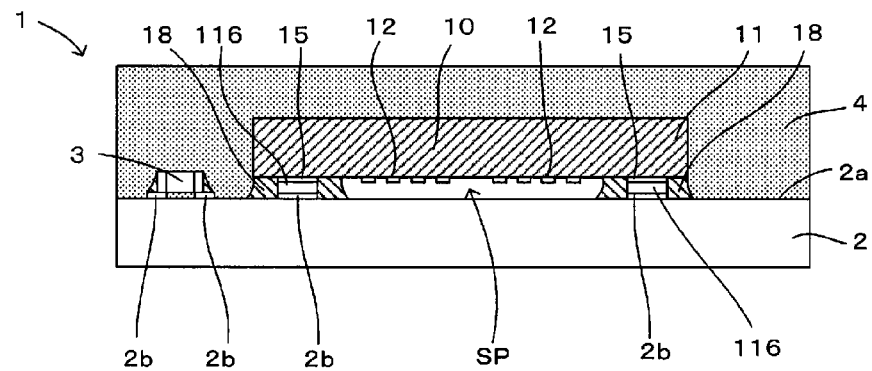

First, as illustrated in FIG. 6A, the duplexer 10 and the module substrate 2 are prepared. The duplexer 10 includes the element substrate 11 with the first principal surface on which the transmission filter element 13, the reception filter element 14, the connection electrodes 17, and the insulating layer 18 surrounding the transmission filter element 13, the reception filter element 14, and the connection electrodes 17 are disposed. The module substrate 2 includes the mounting surface 2a on which the various components 3, which do not include the duplexer 10, are mounted.

Figure 6B:
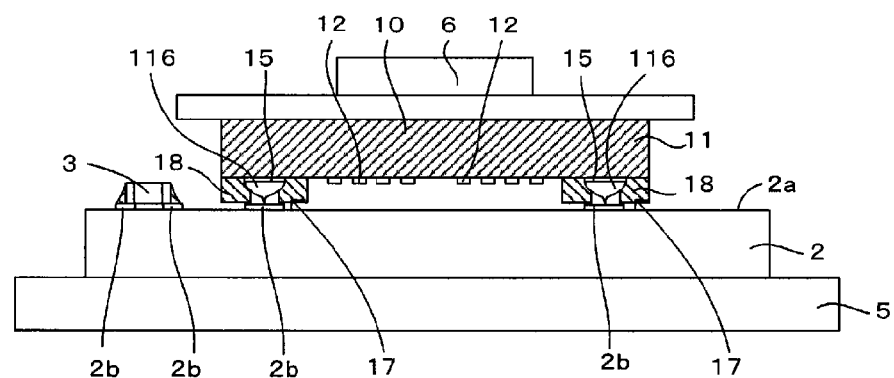

Next, as illustrated in FIG. 6B, the duplexer 10 is mounted on the mounting surface 2a of the module substrate 2 on the stage 5 from the side adjacent to the first principal surface. The duplexer 10 is pressed against the module substrate 2 by the head 6 of the flip chip bonding (FCB) machine including the suction holding mechanism, the heater (not illustrated) included in at least one of the stage 5 and the head 6 starts heating, and the ultrasonic vibration applying device, which is not illustrated, starts applying ultrasonic vibration.

Figure 6C:
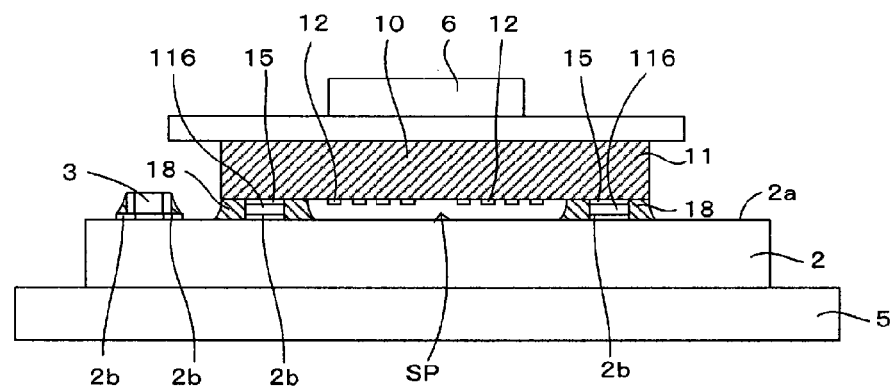

Subsequently, as illustrated in FIG. 6C, the duplexer (element substrate 11) is heated at approximately 120° C. to 180° C. while being pressed against the module substrate 2, and ultrasonic vibration is applied. As a result, the insulating layer 18 softens and is attached to the mounting surface 2a of the module substrate 2 by pressure bonding, and the connection electrodes 17 (metal bumps 116) are attached to the mounting electrodes 2b on the mounting surface 2a of the module substrate 2 by pressure bonding (pressure bonding step).

Next, as illustrated in FIG. 7A, the module substrate 2 with the duplexer 10 mounted thereon is heated by the heating device, such as an oven, in a heating atmosphere at approximately 180° C., which is higher than the curing temperature of the insulating layer 18, for approximately one hour. The curing of the insulating layer 18 is completed. Lastly, the mounting surface 2a of the module substrate 2 on which the duplexer 10 and the various components 3 are mounted is filled with molding resin, it is heated and cured, and thus the molding layer 4 is formed on the module substrate 2. In this way, the composite module 1 is completed.

As described above, the second preferred embodiment provides substantially the same advantageous effects as in the above-described first preferred embodiment. In the present preferred embodiment, each of the metal bumps 116 preferably is made of gold. The material of the metal bump 116 is not limited to gold. The metal bump 116 may be made of other metals, such as silver, copper, platinum, or palladium, or a brazing material, such as SnAu. Because the height of the surface of the metal bump 116 is substantially the same as or smaller than that of the insulating layer 18, the surface of the metal bump 116 is prevented from surface contamination or flawed.

Third Preferred Embodiment

Figure 8:
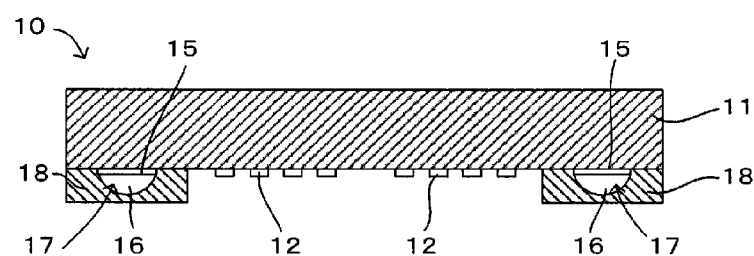
FIG. 8 illustrates an electronic component in a composite module according to a third preferred embodiment of the present invention.

A third preferred embodiment of a composite module including an electronic component (duplexer) according to the present invention is described below with reference to FIG. 8. FIG. 8 illustrates the electronic component in the composite module according to the third preferred embodiment of the present invention.

The third preferred embodiment differs from the above-described first preferred embodiment in that the insulating layer 18 in the duplexer 10 is arranged on the first principal surface so as to cover the entire surface of each of the connection electrodes 17, as illustrated in FIG. 8. The other configuration is preferably the same or substantially the same as that in the above-described first preferred embodiment. The same reference numerals are used to indicate the same or similar elements, and thus the description thereof is omitted.

With this configuration, the duplexer 10 (element substrate 11) is heated at approximately 100° C. while being pressed against the module substrate 2, thus softening the insulating layer 18 and attaching it to the mounting surface 2a of the module substrate 2 by pressure bonding. The connection electrode 17 (metal bump 16) presses and breaks through the softened insulating layer 18, and the connection electrode 17 comes into contact with the mounting electrodes 2b on the mounting surface 2a of the module substrate 2 and is attached thereto by pressure bonding.

As described above, the third preferred embodiment provides substantially the same advantageous effects as in the above-described first preferred embodiment and also provides advantageous effects described below. That is, because the insulating layer 18 is arranged on the first principal surface of the element substrate 11 so as to cover the entire surface of the connection electrode 17, foreign matter is prevented from adhering to the connection electrode 17 on the first principal surface of the element substrate 11 before the element substrate is mounted on the module substrate 2 in a process for manufacturing the composite module 1.

Fourth Preferred Embodiment

Figure 9:
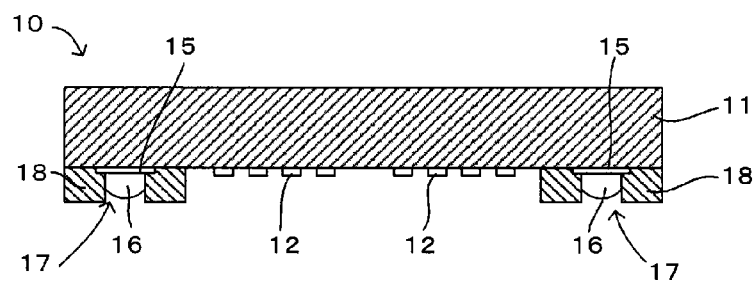
FIG. 9 illustrates an electronic component in a composite module according to a fourth preferred embodiment of the present invention.
Figure 10:
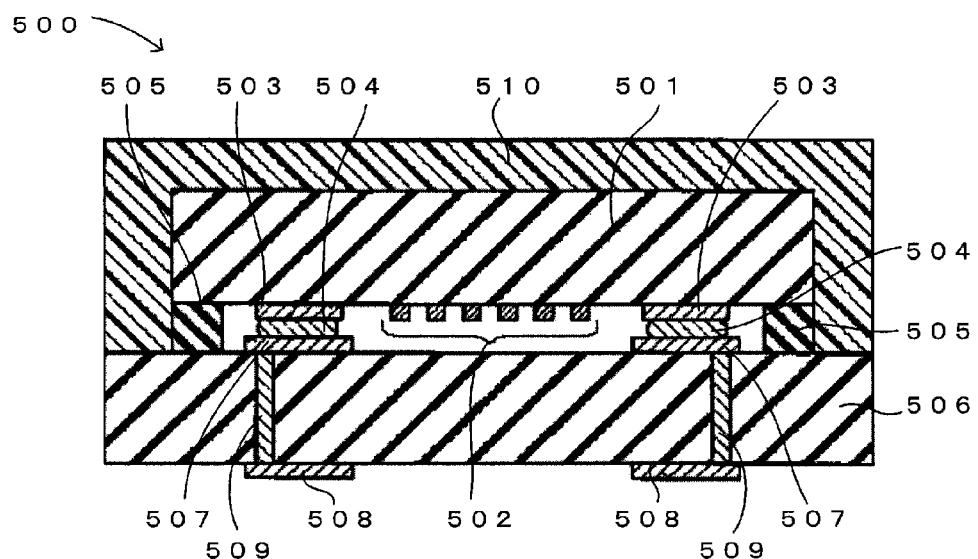
FIG. 10 illustrates one example of a known electronic component.

A fourth preferred embodiment of a composite module including an electronic component (duplexer) according to the present invention is described below with reference to FIG. 9. FIG. 9 illustrates the electronic component in the composite module according to the fourth preferred embodiment of the present invention.

The fourth preferred embodiment differs from the above-described first preferred embodiment in that, as illustrated in FIG. 9, after the insulating layer 18 surrounding the comb-shaped electrodes 12 and the terminal electrodes 15 and covering the entire periphery of the edge portion of each of the terminal electrodes 15 is formed on the first principal surface of the element substrate 11 on which the comb-shaped electrodes 12 and the terminal electrodes 15 are disposed, the metal bumps are formed by providing conductive paste onto the terminal electrode 15 or applying via-filling plating thereto. The other configuration is preferably the same or substantially the same as that in the above-described first preferred embodiment. The same reference numerals are used to indicate the same or similar elements, and thus the description thereof is omitted.

As described above, the fourth preferred embodiment provides the same or substantially the same advantageous effects as in the above-described first preferred embodiment.

The present invention is not limited to the above-described preferred embodiments. In addition to the above-described preferred embodiments, various modifications may be made without departing from the spirit or scope of the present invention. For example, in the above-described preferred embodiments, the functional elements according to the present invention preferably are the transmission filter element 13 and the reception filter element 14 including SAW filter elements. The electronic component may be formed such that the element substrate is a silicon substrate, and the functional elements, such as BAW filter elements or MEMS filter elements, are disposed on the first principal surface of the element substrate. The electronic component according to a preferred embodiment of the present invention may include a switch IC including a switch element having a mechanical operating portion on the first principal surface of the element substrate. The type of the electronic component is not limited to the above-described examples. The electronic component may be any type in which the functional elements are disposed on the first principal surface of the element substrate. In the above-described preferred embodiments, the transmission filter and the reception filter are preferably provided on the same piezoelectric substrate. However, the filters may be provided on different substrates.

The composite module is not limited to the above-described examples. The composite module may have various functions achieved by various electronic components mounted on the module substrate.

In the above-described preferred embodiments, the connection electrode in the electronic component and the mounting electrode in the module substrate are connected to each other preferably by melting of solder and/or application of ultrasonic vibration. The connection electrode in the electronic component and the mounting electrode in the module substrate may be connected to each other using metal nanoparticle paste or conductive adhesive.

In the above-described preferred embodiments, solder having a melting temperature higher than both the melting temperature of the solder forming the connection electrode 17 and the curing temperature of the insulating layer 18 may preferably be used in mounting the components 3 on the mounting surface 2a of the module substrate 2. This prevents various problems resulting from solder re-melting, such as degradation in the mounted state of the components 3 on the module substrate 2 resulting from re-melting of the solder used in mounting the components 3 on the module substrate 2 when the electronic component is mounted on the module substrate 2.

Preferred embodiments of the present invention can be widely applied to electronic components including element substrates with first principal surfaces on which functional elements are disposed and to composite modules including the electronic components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
an element substrate;
a functional element disposed on a first principal surface of the element substrate;
a terminal electrode disposed on the first principal surface;
a connection electrode disposed on the first principal surface with the terminal electrode interposed between the connection electrode and the first principal surface, and the connection electrode being electrically coupled to the functional element; and
an insulating layer disposed on the first principal surface and directly surrounding the connection electrode and a space that includes the functional element; wherein
the insulating layer is disposed on the first principal surface so as to cover an entire surface of the connection electrode;
the insulating layer directly and completely covers a side surface of the terminal electrode;
the insulating layer directly and completely covers the entire surface of the connection electrode;
a height of the insulating layer measured from the first principal surface is equal to or greater than a height of the connection electrode measured from the first principal surface;
the connection electrode is made of solder;
the insulating layer is made of resin that softens at a temperature lower than a melting temperature of the solder and that cures at the melting temperature of the solder;
an outer peripheral side surface of the insulating layer is co-planar or substantially co-planar with an outer peripheral side surface of the element substrate; and
a curing temperature of the resin of the insulating layer is equal to or higher than 180° C.

2. The electronic component according to claim 1, wherein
the element substrate is made of a piezoelectric material; and
the functional element is a SAW filter element including a comb-shaped electrode located on the first principal surface.

3. The electronic component according to claim 1, wherein the functional element is one of a transmission filter element, a reception filter element, a bulk acoustic wave element, and a MEMS filter element.

4. The electronic component according to claim 1, wherein the element substrate is one of a piezoelectric substrate and a silicon substrate.

5. A composite module comprising:
a module substrate on which the electronic component according to claim 1 is mounted; wherein
the electronic component is mounted on a mounting surface of the module substrate from the first principal surface side, and the space is defined between the element substrate and the module substrate.

6. The composite module according to claim 5, wherein the functional element is one of a transmission filter element, a reception filter element, a bulk acoustic wave element, and a MEMS filter element.

7. The composite module according to claim 5, wherein the element substrate is one of a piezoelectric substrate and a silicon substrate.

8. The composite module according to claim 5, wherein the composite module is a high-frequency antenna switch module.

9. The composite module according to claim 5, further comprising at least one of a switch IC, a filter, a chip resistor, a chip capacitor, and a chip coil.

10. The composite module according to claim 5, wherein, prior to mounting the electronic component on the module substrate, the height of the insulating layer measured from the first principal surface is greater than the height of the connection electrode measured from the first principal surface.

11. The electronic component according to claim 1, wherein the connection electrode is made of Sn—Ag—Cu, and the terminal electrode is made of at least one of aluminum, copper, nickel, gold, and platinum.

12. A composite module comprising:
a module substrate including mounting electrode; and
an electronic component mounted on the module substrate, the electronic component including:
an element substrate;
a functional element disposed on a first principal surface of the element substrate;
a terminal electrode disposed on the first principal surface;
a connection electrode disposed on the first principal surface with the terminal electrode interposed between the connection electrode and the first principal surface, and the connection electrode being electrically coupled to the functional element; and
an insulating layer disposed on the first principal surface and directly surrounding the connection electrode and a space that includes the functional element; wherein
the insulating layer is disposed on the first principal surface so as to cover an entire surface of the connection electrode;
the insulating layer directly and completely covers a side surface of the mounting electrode and a side surface of the terminal electrode;
the insulating layer directly and completely covers the entire surface of the connection electrode;
a height of the insulating layer measured from the first principal surface is equal to or greater than a height of the connection electrode measured from the first principal surface;
the connection electrode is made of solder;
the insulating layer is made of resin that softens at a temperature lower than a melting temperature of the solder and that cures at the melting temperature of the solder;
an outer peripheral side surface of the insulating layer is co-planar or substantially co-planar with an outer peripheral side surface of the element substrate; and
a curing temperature of the resin of the insulating layer is equal to or higher than 180° C.; wherein
the electronic component is mounted on a mounting surface of the module substrate from the first principal surface side, and the space is defined between the element substrate and the module substrate.

\* \* \* \* \*